United States Patent
Magnusson et al.

(10) Patent No.: US 12,007,695 B2
(45) Date of Patent: Jun. 11, 2024

(54) RAPID LARGE-SCALE FABRICATION OF METASURFACES WITH COMPLEX UNIT CELLS

(71) Applicant: BOARD OF REGENTS, THE UNIVERSITY OF TEXAS SYSTEM, Austin, TX (US)

(72) Inventors: Robert Magnusson, Arlington, TX (US); Kyu Lee, Euless, TX (US); Hafez Hemmati, Arlington, TX (US); Pawarat Bootpakdeetam, Arlington, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 105 days.

(21) Appl. No.: 17/150,171

(22) Filed: Jan. 15, 2021

(65) Prior Publication Data
US 2021/0216020 A1 Jul. 15, 2021

Related U.S. Application Data

(60) Provisional application No. 62/961,457, filed on Jan. 15, 2020.

(51) Int. Cl.
*G03F 7/00* (2006.01)
*G03F 7/09* (2006.01)
*G03F 7/16* (2006.01)

(52) U.S. Cl.
CPC ........ *G03F 7/70408* (2013.01); *G03F 7/0035* (2013.01); *G03F 7/094* (2013.01); *G03F 7/162* (2013.01)

(58) Field of Classification Search
CPC .... G03F 7/70408; G03F 7/162; G03F 7/2053; G03F 7/70466
See application file for complete search history.

(56) References Cited

U.S. PATENT DOCUMENTS

| | | | | |
|---|---|---|---|---|
| 4,496,216 A | * | 1/1985 | Cowan | G02B 5/32 359/566 |
| 6,618,174 B2 | * | 9/2003 | Parker | G02B 5/32 359/33 |

(Continued)

OTHER PUBLICATIONS

Chih-Hao Chang, Y. Zhao, R. K. Heilmann, and M. L. Schattenburg, "Fabrication of 50 nm period gratings with multilevel interference lithography", Optics Letters / vol. 33, No. 14 / Jul. 15, 2008 (Year: 2008).*

(Continued)

*Primary Examiner* — Mark F. Huff
*Assistant Examiner* — Alexander Nicholas Lee
(74) *Attorney, Agent, or Firm* — John P. Zimmer; Candice Cashman; Maynard Nexsen PC

(57) ABSTRACT

A method of fabricating a metasurface comprises coating a photoresist film onto a substrate and loading the coated substrate into a laser interference lithography setup, exposing the photoresist film via a laser with a first interference pattern, the first interference pattern having a first period and a first exposure energy, subsequently exposing the coated substrate with a second interference pattern, the second interference pattern having a second period and a second exposure energy, developing the exposed portions of the photoresist film to form a periodic pattern in the photoresist, and transferring the periodic pattern into the substrate, the substrate supporting an appropriate film system that embodies the final metasurface device.

10 Claims, 8 Drawing Sheets

(56) References Cited

U.S. PATENT DOCUMENTS 6,830,850 B1 * 12/2004 Krivokapic .......... G03H 1/0248
430/394
2008/0119028 A1 * 5/2008 Akiyama .......... H01L 21/76254
257/E29.295

OTHER PUBLICATIONS

Jong-Bin Yeo, Sang-Don Yun, Nam-Hoon Kim, et al., "Fabrication of Si-based two-dimensional photonic quasicrystals by using multipleexposure holographic lithography", J. Vac. Sci. Technol. B 27(4), Jul./Aug. 2009 (Year: 2009).*
Seyedeh Mahsa Kamali, Ehsan Arbabi, Hyounghan Kwon and Andrei Faraon, "Metasurface-generated complex 3-dimensional optical fields for interference lithography", National Academy of Sciences, vol. 116, No. 43, Oct. 22, 2019 (Year: 2019).*
Zuojun Zhang, Jun Luo, Maowen Song, et al., "Large-area, broadband and highefficiency near-infrared linear polarization manipulating metasurface fabricated by orthogonal interference lithography", Appl. Phys. Lett. 107, 241904 (2015) (Year: 2015).*
Roberto Fallica, Robert Kirchner, Helmut Schift, Yasin Ekinci, "High-resolution grayscale patterning using extreme ultraviolet interference lithography", Microelectronic Engineering, vol. 177, 2017, pp. 1-5, ISSN 0167-9317 (Year: 2017).*

* cited by examiner

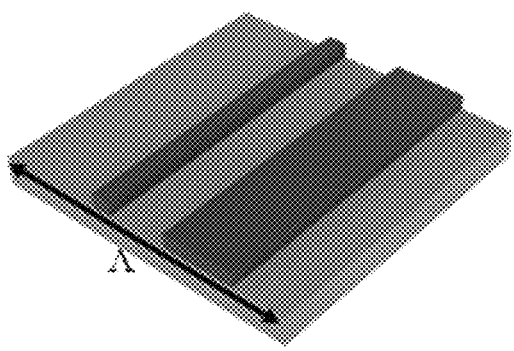
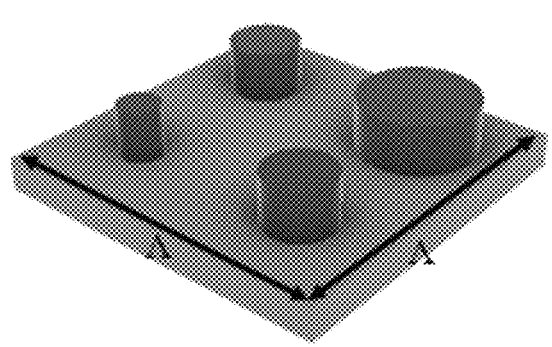
FIG. 6A  FIG. 6B
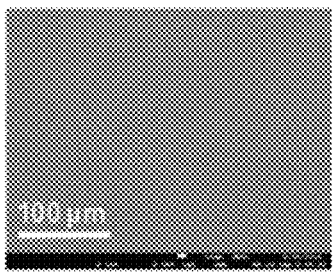
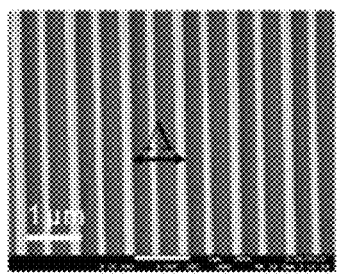
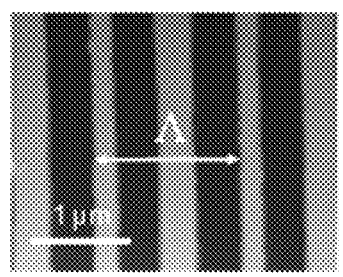
FIG. 6C  FIG. 6D
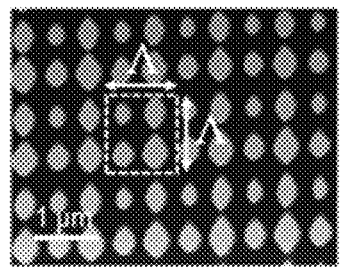
FIG. 6E  FIG. 6F

RAPID LARGE-SCALE FABRICATION OF METASURFACES WITH COMPLEX UNIT CELLS

RELATED APPLICATION DATA

This application claims priority under 35 U.S.C. § 119(e) to U.S. Provisional Patent Application No. 62/961,457 filed Jan. 15, 2020, the entirety of which is incorporated by reference herein.

STATEMENT REGARDING GOVERNMENT FUNDING

This invention was made with government support under grant no. ECCS-1606898 and grant no. ECCS-1809143 awarded by the National Science Foundation. The government has certain rights in the invention.

FIELD

The technology described herein generally relates to photonic devices, and more specifically, to the fabrication of metastructures.

BACKGROUND

In recent decades, there has been an increase in applications related to nanofabrication, and more specifically the fabrication of nanostructures utilizing nanopatterning technologies. The global diffractive optics market has seen an increase in value with advances in academic and industrial applications, for instance any application requiring light interaction and propagation or the manipulation of photons. Diffractive optical elements are used in many industries including information technology and telecommunications, healthcare, optics manufacturing, energy, and display technologies among others.

Periodic diffractive optical elements, sometimes referred to as metasurfaces or metastructures, are a technology that incorporates a wide variety of optical properties and are used as a base or infrastructure which have a wide variety of applications in other technologies or processes, for example in the field of photonics. Some of these metasurfaces have complex unit cell architectures.

Conventional methods of fabricating advanced photonic devices incorporating complex unit cells, however, are generally long and slow processes, having inefficiencies and high costs, and further are not suitable for large surfaces and as such do not provide adequate methods for the rapid fabrication of larger photonic devices having complex unit cells. Accordingly, the technology described herein can overcome issues in conventional methods of fabricating photonic devices, and additionally new devices and technologies can be realized based on such complex multipart fill factor metasurfaces.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

Embodiments of the technology described herein are directed towards the fabrication and/or patterning of periodic and/or aperiodic optical elements or metasurfaces.

According to some embodiments, a method of fabricating a one-dimensional (1D) periodic metasurface is provided. A photoresist film can be coated onto a substrate and implemented in a laser interference lithography setup or apparatus. The photoresist film can be exposed via a laser with a first interference pattern, where the first interference pattern has a first period and a first exposure energy. The photoresist film can subsequently be exposed with a second interference pattern, the second interference pattern having a second period and a second exposure energy. The exposed portions of the photoresist film can then be developed to form a one-dimensional periodic pattern in the photoresist and the one-dimensional periodic pattern can be transferred into the substrate.

According to some further embodiments, a method of fabricating a two-dimensional (2D) periodic metasurface is provided. A photoresist film can be coated onto a substrate and implemented in a laser interference lithography setup or apparatus. The photoresist film can be exposed via a laser with a first interference pattern, where the first interference pattern has a first period and a first exposure energy. The photoresist film can subsequently be exposed with a second interference pattern, the second interference pattern having a second period and a second exposure energy. After the second exposure, the photoresist coated substrate can be rotated. The photoresist film can subsequently be exposed with a third interference pattern, the third interference pattern having a third period and a third exposure energy, and a fourth interference pattern, the fourth interference pattern having a fourth period and a fourth exposure energy. The exposed portions of the photoresist film can then be developed to form a two-dimensional periodic pattern in the photoresist and the two-dimensional periodic pattern can be transferred into the substrate.

Additional objects, advantages, and novel features of the invention will be set forth in part in the description which follows, and in part will become apparent to those skilled in the art upon examination of the following, or can be learned by practice of the invention.

BRIEF DESCRIPTION OF THE DRAWINGS

Aspects of the technology presented herein are described in detail below with reference to the accompanying drawing figures, wherein:

FIGS. 6A-F are schematics of exemplary 1D and 2D metasurfaces and corresponding Scanning Electron Microscope (SEM) and AFM images, fabricated in accordance with some aspects of the technology described herein;

DETAILED DESCRIPTION

Figure 1A:
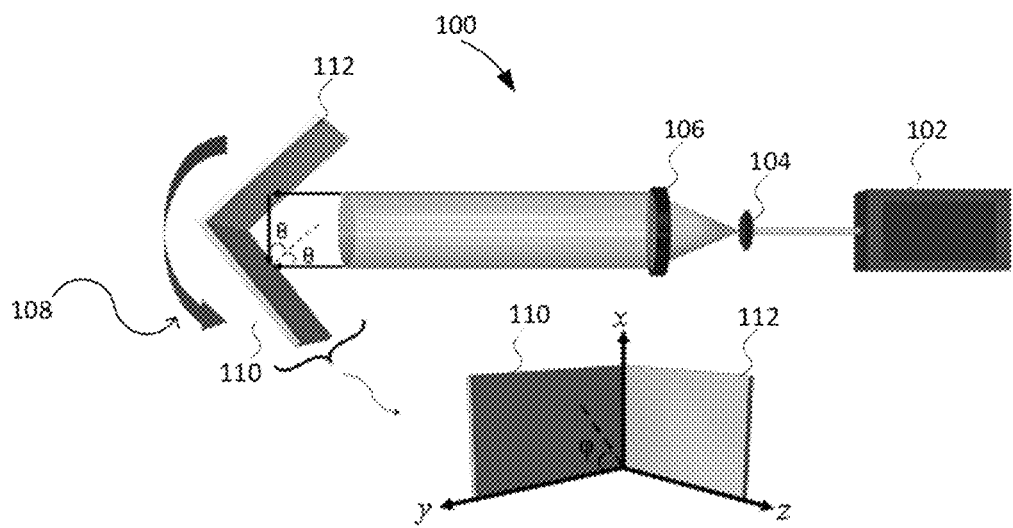
FIGS. 1A-B show a diagram of an example lithography system in accordance with some aspects of the technology described herein.

The subject matter of aspects of the present disclosure is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" can be used herein to connote different elements of methods employed, the terms should not be interpreted as implying any particular order among or between various steps disclosed herein unless and except when the order of individual steps is explicitly described.

Accordingly, embodiments described herein can be understood more readily by reference to the following detailed description, examples, and figures. Elements, apparatus, and methods described herein, however, are not limited to the specific embodiments presented in the detailed description, examples, and figures. It should be recognized that the exemplary embodiments herein are merely illustrative of the principles of the invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" or "5 to 10" or "5-10" should generally be considered to include the end points 5 and 10.

Further, when the phrase "up to" is used in connection with an amount or quantity; it is to be understood that the amount is at least a detectable amount or quantity. For example, a material present in an amount "up to" a specified amount can be present from a detectable amount and up to and including the specified amount.

Additionally, in any disclosed embodiment, the terms "substantially," "approximately," and "about" may be substituted with "within [a percentage] of" what is specified, where the percentage includes 0.1, 1, 5, and 10 percent.

Optical elements, such as diffractive optical elements (also referred to as metasurfaces, metafilms, or metastructures), that are composed of periodic and/or aperiodic wavelength-scale features can be made with good effective properties to enable the manipulation of electromagnetic waves that can be used in a wide variety of photonics applications. These elements or metasurfaces can serve as compact alternatives to conventional bulk optical devices and enable enhanced design options. By varying the periodicity of the features of such elements (or metasurfaces) incorporated into a material, such as a lossless dielectric material, the operating wavelength of an optical element can be tuned, for example ranging from ultraviolet (UV) to radio frequency (RF). According to various methods described herein, new classes of metasurfaces can be realized having applications, for example, in imaging, object levitating, light propelled spacecraft, and other areas, particularly when patterning on large areas, for example ~1 m is required. According to methods described herein, four-part and multipart unit-cell 1D and 2D periodic patterns can be created in a photoresist layer on a substrate, followed by etching to transfer the created patterns into the substrate (e.g. silicon-on-quartz) platform for near-IR band device applications. Additionally, through selection of the two base periods large size unit cells may be achieved, for example millimeter scale, having aperiodic metastructures with one overall period.

Described herein are methods for the fabrication of complex periodic and/or aperiodic metasurfaces that are fast, cost-effective, and can be applied to large surface areas. Generally, methods described herein comprise the fabrication or generation of complex metasurfaces (such as 1D and 2D four-part fill factor or multipart fill factor metasurfaces) based on multiple, sequential exposures of a photoresist coated substrate by laser interference lithography via control over exposure periodicity and exposure energy. According to methods described herein, complex multipart fill-factor metasurfaces can be generated. Additionally, periodic and/or aperiodic patterns on large substrates can be realized.

According to various embodiments of the technology described herein, methods for the rapid and/or large-scale (i.e. on a large surface) fabrication of photonic devices or diffractive optical elements (i.e. metasurfaces) having complex unit-cells are provided. In some example embodiments, the fabricated photonic devices have periodic patterning, and in others, the fabricated photonic devices have aperiodic patterning. It will be appreciated that photonic devices and/or diffractive elements described herein can also be known as metasurfaces, metastructures, and/or metafilms, among others. Such devices, for instance, permit manipulation of optical waves for various functions, such as spectral filtering, polarization control, antireflection, focusing, sensing, among others.

According to some embodiments, four-part and/or multipart periodic unit-cell metasurfaces or metastructures can be fabricated by applying two or more time-based exposures generated by a laser interference lithography system. Methods described herein utilize the interactive nature between two or more different periodic light patterns (e.g. UV light) with controlled exposure parameters, for example time and periodicity parameters.

According to some aspects of the present technology, a rapid patterning and/or fabrication process of one-dimensional (1D) and two-dimensional (2D) periodic and/or aperiodic metasurfaces is provided. In some instances, the metasurfaces are patterned and/or fabricated with multi fill-factor unit cells, for example utilizing laser interference lithography (LIL). Among nanofabrication methods, LIL enables rapid fabrication of high-quality (or high resolution) periodic structures on both small and large surface areas. According to methods provided herein, versatility in fabricating diffractive elements and metastructures is realized as periodicity and thus the fill factors of the resultant metastructures are able to be manipulated. It will be appreciated that LIL is based on interference patterns generated by at least two coherent laser beams. Accordingly, various aspects of the present technology realize the fabrication of non-conventional periodic (or aperiodic) patterns on large substrates. By utilizing a two beam interference configuration with multiple sequential exposures, improved control over the interference fringe contrast in each exposure that translates to resultant pattern features can be achieved.

In one aspect, two or more controlled exposures having altered periodicities between the exposures are used while maintaining the orientation (i.e. without rotating the substrate, e.g. $\varphi=0°$) to pattern and/or fabricate a 1D four-part fill factor metasurface or grating. In another aspect, two or more controlled exposures having altered periodicities between the exposures are used while altering the orientation of the substrate, for example rotating the substrate $\varphi=90°$, to pattern and/or fabricate a 2D four-part fill factor metasurface or grating. In an even further aspect, multipart fill factor (i.e. greater than four) metasurfaces or gratings can also similarly be achieved.

Figure 1B:
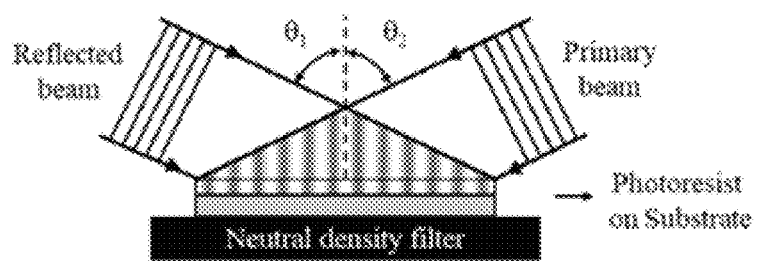

Referring now to the figures, with reference to FIGS. 1A-B, FIG. 1A depicts a diagram of an example lithography system 100 with which some embodiments of the present disclosure can be employed for the patterning and/or fabrication of metastructures. It should be understood that this and other arrangements described herein are set forth as only examples. Other arrangements and elements can be used in addition to, or instead of, those shown, and some elements can be omitted altogether for the sake of clarity. Among components shown, laser interference lithography system 100 includes a laser 102 (for example a UV laser), a pinhole 104 (or aperture), a collimating lens 106, and a rotating stage 108 which is made up of a sample holder 110 and a mirror 112. As depicted, the configuration of the laser interference lithography system 100 can be such that the mirror 112 is mounted orthogonally to the sample holder 110. In various embodiments, a substrate, for example a substrate coated with a photoresist film, can be placed in sample holder 110. In operation, periodic fringes can be generated by two-wave interference via constructive and destructive interference between the two parts of the collimated laser beam when they come together in phase onto a sample surface.

Looking at FIG. 1B, a general two-beam interference instance is depicted, for example utilizing laser interference lithography system 100. Accordingly, the periodicity of the interference fringes (i.e. periodic fringe pattern) is defined by $\Lambda=\lambda/(\sin\theta_1+\sin\theta_2)$ where $\lambda$ is the laser wavelength and $\theta_1$ and $\theta_2$ are the angles between the sample substrate surface normal and the incidence direction of each of the two beams (i.e. primary beam and reflected beam), or in other words, the angles between the normal to the substrate surface and the direction of the incident beams. As depicted, the two beams and the surface normal to the substrate lie in the plane of incidence. The periodicity of the interference pattern can be controlled by the changing the incident angle of the incoming beams. It will be appreciated that maximum interference fringe contrast results when the two beams are co-polarized in the transverse electric (TE) polarization state. The stationary light fringes can expose photoresist (PR) coated on a substrate. The substrate coated with the PR film can, for example, be a simple substrate of glass, quartz, or other semiconductor or dielectric materials. The substrate can also carry a single silicon film, such as silicon-on-quartz (SOQ), silicon-on-insulator (SOI), or can carry other films as well, such as germanium (Ge), germanium-on-zinc selenide (Ge—ZnSe), germanium-on-zinc sulfide (Ge—ZnS), zinc selenide (ZnSe), zinc sulfide (ZnS), among others. Accordingly, systems of films (i.e. more than 1) can be carried on the substrate. It will be appreciated that any film or combination of films suitable for optical systems can be used, and are contemplated herein. In these instances, the PR can be coated (e.g. via spin coating) on these additional films or film systems carried on the substrate. Additionally, a neutral density filter (NDF) or backside antireflection coating (BARC) can be utilized to minimize reflections from any of the surfaces below the PR film. Furthermore, metal films, for example Au, Ag, and Al, among others, can be utilized to yield various metallic metasurfaces.

Figure 2:
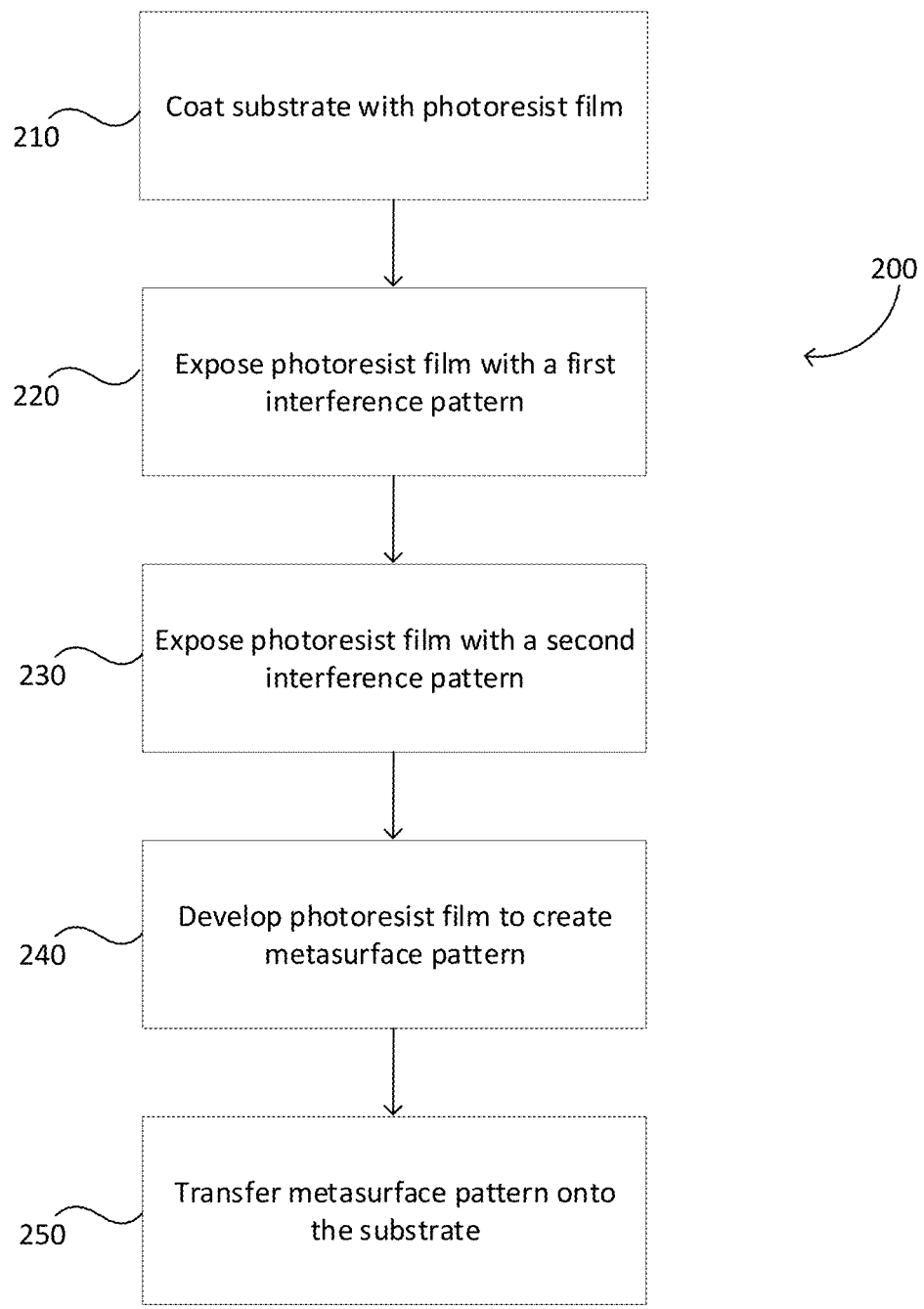
FIG. 2 is a flow diagram showing a method for fabricating a metasurface, in accordance with some aspects of the technology described herein.

Turning now to FIG. 2, a flow diagram is provided illustrating one example method 200 for patterning and/or fabricating a one-dimensional periodic and/or aperiodic multipart unit cell (i.e. having a multipart fill factor) metasurface. It is contemplated that method 200 and other methods described herein are not limited to those illustrated and can incorporate other blocks or steps at any point in the method in accordance with the present disclosure.

At step 210, a substrate (or substrate plus film or film system) can be provided and coated with a photoresist (PR) film, for example the substrate is coated with the PR film via spin coating. In some instances, the substrate can include one or more additional layers, for example the substrate can carry a single dielectric or semiconductor film onto which the PR is coated. In some other instances, the substrate can carry a system of layers or films onto which the PR is coated. In some embodiments, the substrate material system is a silicon-on-quartz or silicon-on-insulator material system. The coated substrate can then be incorporated into a lithography system, such as a laser interference lithography system (e.g. FIG. 1). At step 220, the photoresist film of the coated substrate can be exposed with a first interference pattern, the first interference pattern having a first exposure period and a first dose of exposure energy. Periodicity (i.e. the exposure period) with respect to any of the embodiments herein can be determined by $\Lambda=\lambda/2\sin\theta$, where $\lambda$ is the wavelength of the laser utilized and $\theta$ is the bisector of the angle between the two interfering laser beams. The angle $\theta$ can be controlled by rotating the stage of the laser interference lithography configuration (e.g. 108 of FIG. 1). Accordingly, changing $\theta$ enables the periodicity of the resulting metasurface or grating to be changed or varied. Exposure dose or exposure energy $E=It$, and can be determined or controlled by changing time $t$ where $I=$constant. Thus, the interference pattern used to expose the photoresist film of the coated substrate can be determined by the exposure period and the exposure energy and can be tuned or optimized by changing the angle $\theta$ in the LIL system and the exposure time $t$. It will be appreciated that any suitable angle $\theta$ and exposure time $t$ may be selected based on the desired resultant metasurface architecture.

At step 230, the photoresist film of the coated substrate can be exposed with a second interference pattern, the second interference pattern having a second exposure period and a second dose of exposure energy. In some instances, during the first exposure of the photoresist film a first portion of the photoresist film is exposed with the first interference pattern, and during the second exposure of the photoresist film a second portion of the photoresist film is exposed with the second interference pattern. It will be appreciated that the exposure time for the first exposure and the exposure time for the second exposure can be optimized in such a way that the first exposure can cause the PR to be underexposed, and the second exposure dose can add to the first exposure dose resulting in two different grating ridge widths of the metasurface (e.g. FIG. 4). Control over the periodicity or exposure period and exposure time can enable the tuning of the metasurface patterning for optimization and subsequent repeat patterning and/or fabrication. In some instances, the first exposure period and the second exposure period can have a large least common multiple (LCM) such that large periods having multiple fill factors are realized, for example a final device period (based on the first exposure period and the second exposure period) can be greater than 1 mm.

At step 240, the photoresist film, more specifically the exposed photoresist film, is developed to form a one-dimensional (1D) periodic pattern on the substrate (i.e. within the PR). At step 250, the one dimensional periodic pattern is transferred into the substrate, for example by reactive ion etching (ME), thereby generating a one-dimensional periodic metasurface. It will be appreciated that the etching time can define the thickness of the final metasurface or grating.

Figure 3:
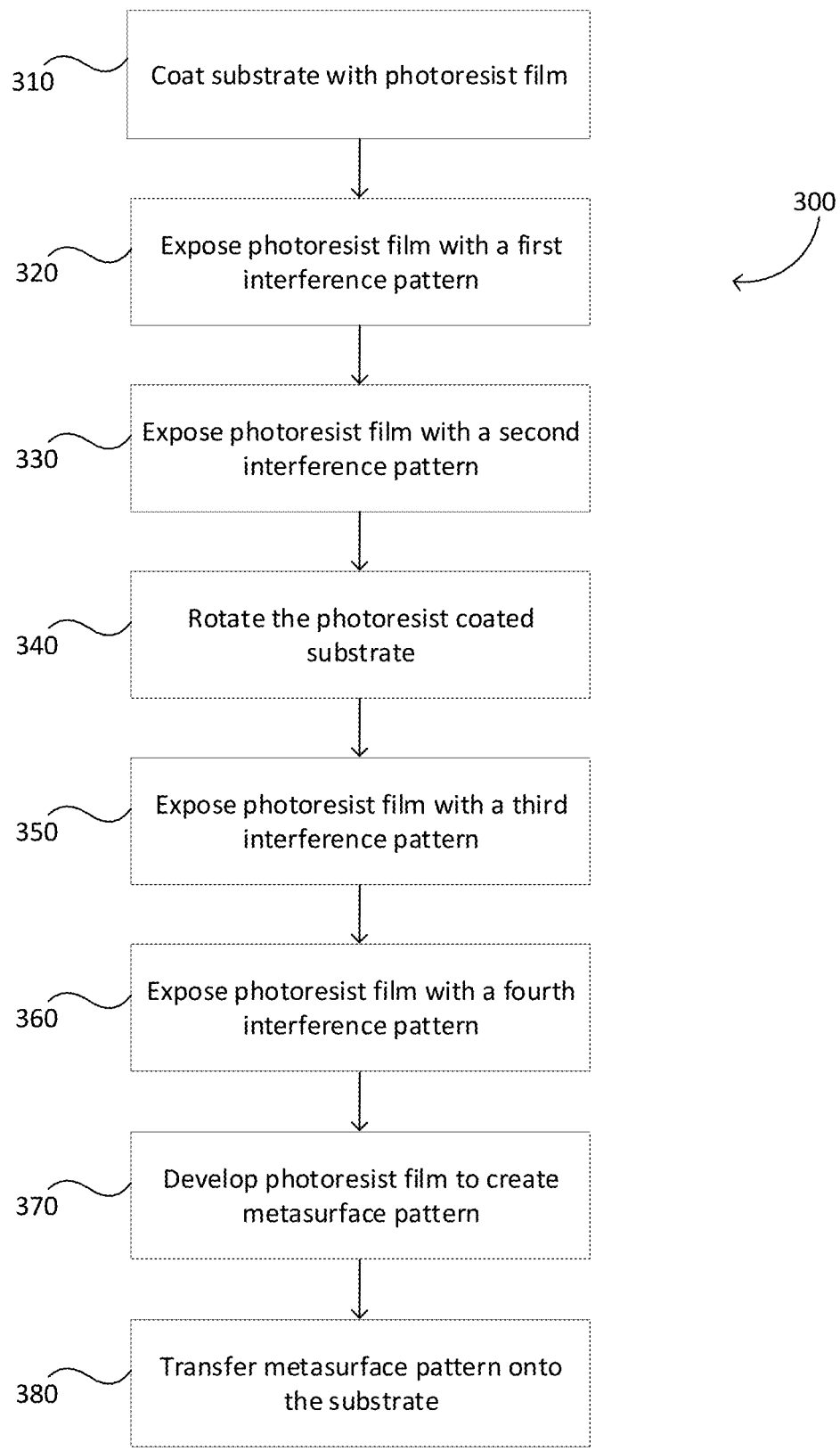
FIG. 3 is a flow diagram showing a method for fabricating a metasurface, in accordance with some aspects of the technology described herein.

Referring to FIG. 3, a flow diagram is provided illustrating one example method 300 for patterning and/or fabricating a two dimensional periodic and/or aperiodic multipart unit cell metasurface. At step 310, a substrate (or substrate system) can be provided and coated with a photoresist (PR) film, for example the substrate is coated with the PR film via spin coating. In some instances, the substrate can include one or more additional layers, for example the substrate can carry single dielectric or semiconductor film onto which the PR is coated. In some other instances, the substrate can carry a system of layers (for instance one or more material layers in addition to the substrate thereby forming the system of layers carried on the substrate) or films onto which the PR is coated. In some embodiments, the substrate material system is a silicon-on-quartz or silicon-on-insulator material system. The coated substrate can then be incorporated into a lithography system, such as a laser interference lithography system (e.g. FIG. 1). At step 320, the photoresist film of the coated substrate can be exposed with a first interference pattern, the first interference pattern having a first period and a first dose of exposure energy.

At step 330, the photoresist film of the coated substrate is exposed with a second interference pattern, the second interference pattern having a second period and a second dose of exposure energy. In some instances, during the first exposure of the photoresist film a first portion of the photoresist film is exposed with the first interference pattern, and during the second exposure of the photoresist film a second portion of the photoresist film is exposed with the second interference pattern. In some instances, the first exposure period and the second exposure period can have a LCM such that large periods having multiple fill factors are realized, for example a final device period (based on the first exposure period and the second exposure period) can be greater than 1 mm.

At step 340, the coated substrate is rotated in the plane of the coated substrate (e.g. FIG. 1). It is contemplated, however, that the coated substrate may be rotated in another plane as well. The angle of rotation of the coated substrate can be from 0°-90°, for example in some embodiments the coated substrate can be rotated 90°. In some other embodiments, the coated substrate can be rotated 60°.

At step 350, the photoresist film of the coated substrate is exposed with a third interference pattern, the third interference pattern having a third period and a third dose of exposure energy. At step 360, the photoresist film of the coated substrate is exposed with a fourth interference pattern, the fourth interference pattern having a fourth period and a fourth dose of exposure energy. In some instances, during the third exposure of the photoresist film a third portion of the photoresist film is exposed with the third interference pattern, and during the fourth exposure of the photoresist film a fourth portion of the photoresist film is exposed with the fourth interference pattern. In some embodiments, the third period and the third dose of exposure energy equal the first period and the first dose of exposure energy. In some embodiments, the fourth period and the fourth dose of exposure energy are equal to the second period and the second dose of exposure energy. In some instances, the third exposure period and the fourth exposure period can have a large LCM such that large periods having multiple fill factors are realized, for example a final period (based on the third exposure period and the fourth exposure period) can be greater than 1 mm.

At step 370, the photoresist film, more specifically the exposed photoresist film, is developed to form a two-dimensional (2D) periodic pattern on the substrate. At step 380, the two-dimensional periodic pattern is transferred into the substrate, for example by reactive ion etching, thereby generating a two-dimensional periodic metasurface. A metasurface produced in accordance with method 300 can result in a 2D spatially-modulated metasurface, and it will be appreciated that tuning the exposures (e.g. varying the exposure period, time, angle of the substrate, incident angles of the incident beams) can realize a multitude of possible unit-cell architectures.

Accordingly, various aspects of technology for the patterning and/or fabrication of a periodic and/or aperiodic metasurface are described. It is understood that various features, sub-combinations, and modifications of the embodiments described herein are of utility and can be employed in other embodiments without reference to other features or sub-combinations. Moreover, the order and sequences of steps shown in the example methods 200 and 300 are not meant to limit the scope of the present invention in any way, and the steps can occur in a variety of different sequences within various embodiments. Such variations and combinations thereof are also contemplated to be within the scope of embodiments of the invention.

Embodiments described herein can be understood more readily by reference to the following Examples. Elements, apparatus, and methods described herein, however, are not limited to any specific embodiment presented in the Examples. It should be recognized that these are merely illustrative of some principles of this disclosure, and are non-limiting. Numerous modifications and adaptations will be readily apparent without departing from the spirit and scope of the disclosure.

Example 1—Fabrication of a 1D Four-Part Fill Factor Metasurface

To fabricate a metasurface according to the technology described herein, several steps are performed to achieve the desired patterning, for instance determining the periodicity and the laser light intensity for each of one or more exposures of a PR coated substrate. This instant example illustrates fabricating an exemplary 1D four-part fill factor periodic metasurface (i.e. grating) with a periodicity of 1000 nm on silicon-on-quartz (SOQ) wafers. The SOQ wafer used contained 220 nm crystalline silicon on a quartz substrate. It will be appreciated that both the silicon and the quartz are lossless in the near infrared wavelength region.

A 2.5×2.5 $cm^2$ SOQ substrate was provided and spin coated at 3000 rpm with SEPR 701-2.9, a positive photo-resist (PR), for one minute after a primer is applied. The coated substrate was then soft baked for 90 seconds at 110° C. Patterning of the coated substrate was then performed utilizing laser interference lithography (LIL). A mirror laser interference lithography configuration was used in order to pattern the coated substrate (e.g. mirror interference lithography configuration of FIG. 1). A UV laser with 100 mW output power at a wavelength of 266 nm was used for patterning. The intensity of the laser light was measured as I~96 µW/cm² at the sample surface. Periodicity (i.e. the exposure period) was determined by $\Lambda=\lambda/2 \sin \theta$, where $\lambda$ is the wavelength of the laser used (i.e. 266 nm) and $\theta$ is the bisector of the angle between the two interfering laser beams. The angle $\theta$ can be controlled by rotating the stage of the laser interference lithography configuration (e.g. 108 of FIG. 1). Accordingly, changing $\theta$ enables the periodicity of the metasurface or grating to be changed. Exposure dose or exposure energy was calculated by E=It in mJ/cm², and can be controlled or varied by changing time t when I=constant. A ~1 cm² metasurface according to this example was patterned in less than 1 minute.

Figure 4A:
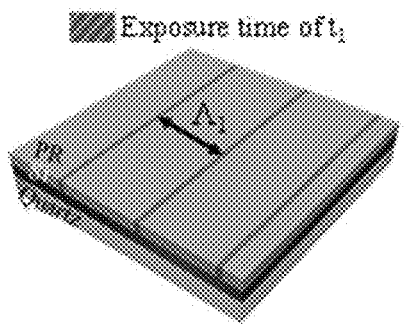
FIGS. 4A-D are schematics of exemplary implementations of fabricating a metasurface, in accordance with some aspects of the technology described herein.
Figure 4B:
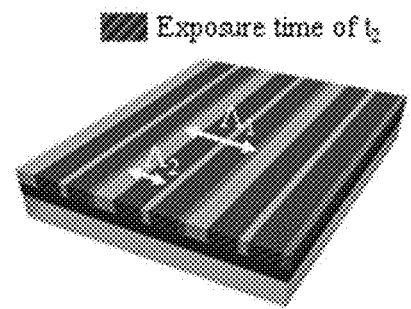
Figure 4C:
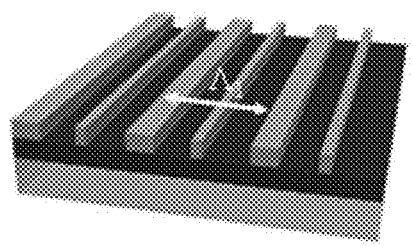
Figure 4D:
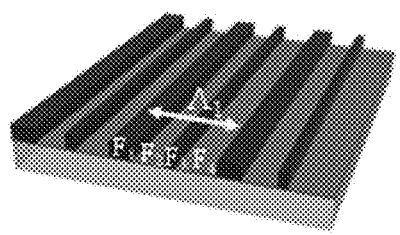

As illustrated in FIG. 4, the 1D four-part fill factor periodic metasurface or grating was produced by double exposing the PR coated substrate with two different periods $\Lambda_1$ and $\Lambda_2$ and two different exposure times $t_1$ and $t_0$ to form a 1D PR mask (e.g. FIG. 4B). In this example the periodicity of the second exposure is half of the first exposure, i.e. $\Lambda_2=½ \Lambda_1$ in order to achieve a uniform four-part fill factor metasurface (e.g. FIG. 3). Here, a four-part fill factor metasurface or grating having a periodicity of 1000 nm is achieved. The longer period $\Lambda_1=1000$ nm is exposed first for 10 seconds followed by a shorter period $\Lambda_2=500$ nm exposed for 34 seconds. In this instance, the longer periodicity defines the periodicity of the final metasurface or grating as shown in FIG. 4C. After exposure of the PR was completed, the substrate was baked at 110° C. for 90 seconds and then developed in AZ 917 MIF developer for 45 seconds. The asymmetric pattern on the PR was then transferred to the crystalline silicon (c-Si) by dry etching in an Oxford PlasmaLab 80plus etcher using $SF_6$ and $CHF_3$ for 7 minutes with an RIE power of 100 W at an etch rate of about 30 nm/min. The remaining PR was then removed using an $O_2$ ashing process. The final metastructure dimensions were measured using scanning electron microscopy (SEM) and atomic force microscopy (AFM). FIG. 4D shows the final etched device.

Figure 5A:
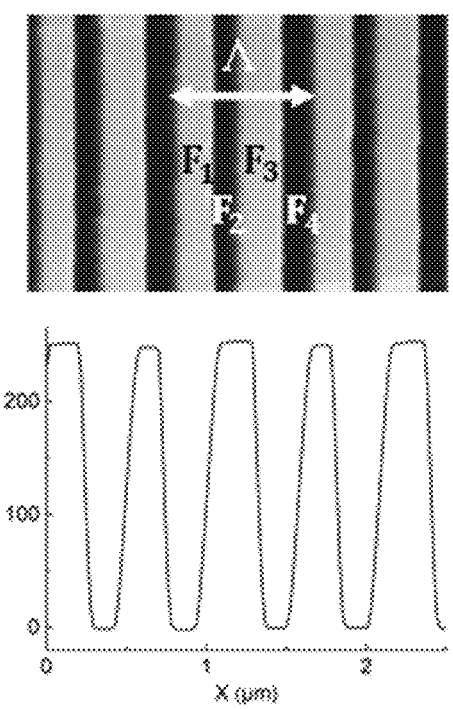
FIGS. 5A-B are Atomic Force Microscopy (AFM) images illustrating example periodic metasurfaces fabricated in accordance with some aspects of the technology described herein.
Figure 5B:
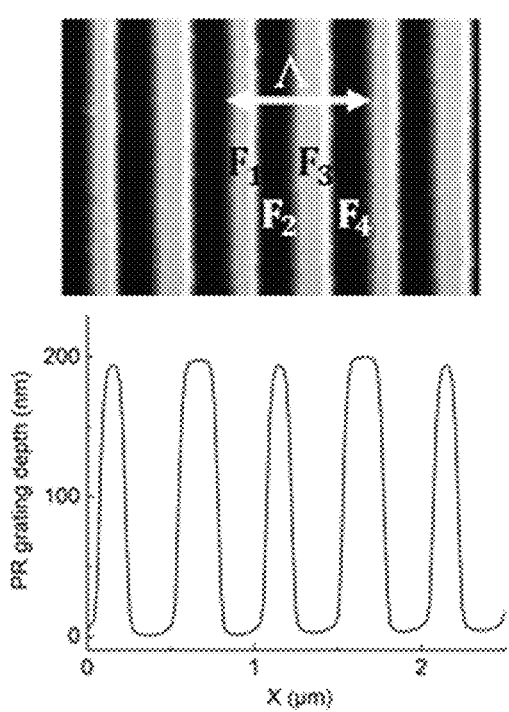

Turning now to FIGS. 5A-B, AFM images relating to implementations of fabricating four-part grating metasurfaces are shown. FIG. 5A and FIG. 5B show AFM images of an example PR patterned four-part fill factor metasurface (or metagrating) at different second exposure times, while the first exposure time is fixed, for example where the first exposure time is $t_1=10$ seconds. FIG. 5A illustrates a metasurface where the second exposure time $t_2=34$ seconds and FIG. 5B illustrates a metasurface where the second exposure time $t_2=45$ seconds. Accordingly, as illustrated, the fill factors of the metasurface can be controlled by the exposure energy. As the second exposure time increases, the fill factors of the pattern of the metasurface can decrease.

Example 2—Fabrication of a 2D Four-Part Fill Factor Metasurface

A similar process to that used in Example 1 was used to fabricate a 2D metasurface. The 2D metasurface was fabricated using two identical exposures at φ=0° followed by two exposures at φ=90°. At each φ about half of the exposure doses used in Example 1 are used to create the 2D metasurface or metastructure. Two exposures were thus carried out at φ=0° with $\Lambda_1=1000$ nm and $t_1=5$ seconds followed by $\Lambda_2=500$ nm and $t_2=17$ seconds. The same exposure periods and times were applied to the PR after the sample was rotated to φ=90°.

FIGS. 6A-F illustrate example fabricated 1D and 2D multipart metasurfaces according to some implementations of the present technology. FIGS. 6A and 6B schematically illustrate 1D and 2D multipart metasurfaces in accordance with the present disclosure. FIGS. 6C and 6D are SEM and AFM images of etched asymmetric four-part periodic metasurface (grating device) fabricated on SOQ wafers, corresponding to the architecture depicted in FIG. 6A. FIGS. 6C and 6D illustrate that within one period, the metasurface shows two different widths of grating ridges and two different widths of grooves (i.e. four-part fill factor). In accordance with Example 1, a double exposure of $\Lambda_1=1000$ nm and $\Lambda_2=500$ nm results in the metasurface fill factors $F_1=0.2$, $F_2=0.34$, $F_3=0.1$, and $F_4=0.36$. FIGS. 6E and 6F are SEM and AFM images of an etched 2D asymmetric unit cell fabricated by four exposures in accordance with Example 2.

Example 3—Fabrication of a Multi-Part Fill Factor Metasurface

Figure 7A:
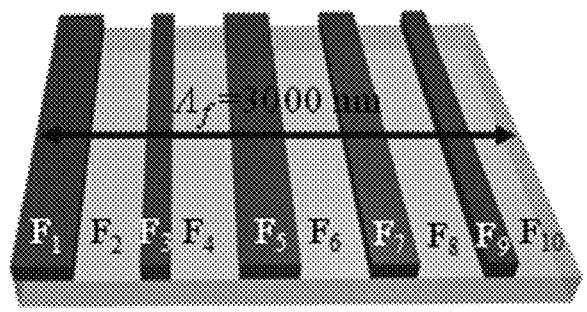
FIGS. 7A-E are schematics of an example multipart fill factor metasurface and corresponding AFM images, fabricated in accordance with some aspects of the technology described herein.
Figure 7B:
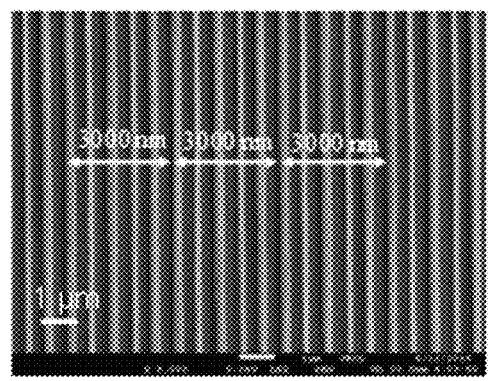
Figure 7C:
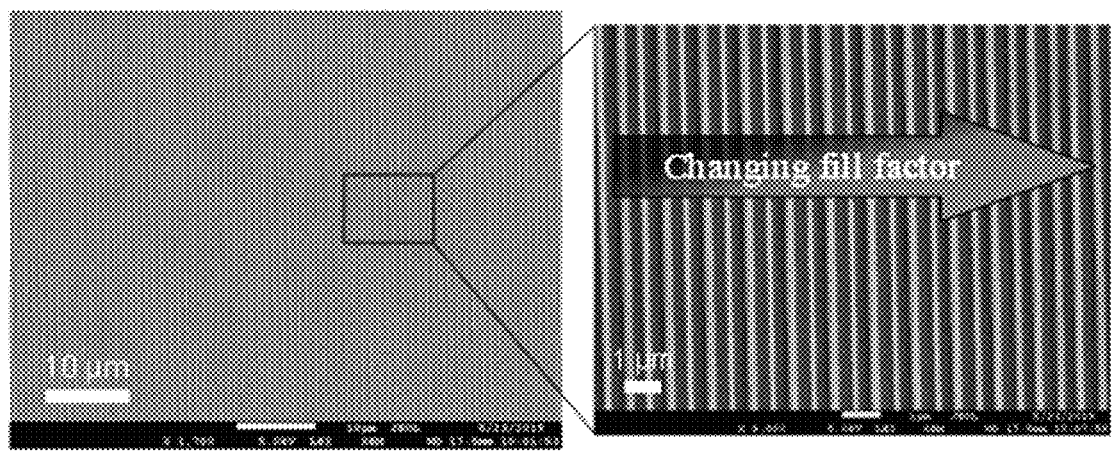
Figure 7D:
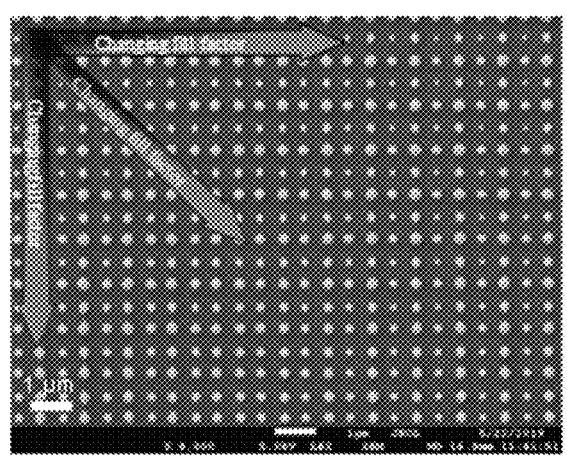

Turning now to FIGS. 7A-E, the methods described herein not only can be implemented to fabricate four-part unit cell (i.e. four-part periodicity as shown in FIGS. 6A-B) but can also be used to fabricate multipart (i.e. greater than four) unit cell diffractive elements and metasurfaces. Accordingly, multipart unit cell metasurface can be realized if the second exposure periodicity is not equal to half of the first exposure period, i.e. $\Lambda_2 \neq ½ \Lambda_1$. In this situation, the final period of the metasurface is not defined by the longer period as with the above four-part unit cell metasurface examples. Instead, the final period of the metasurface is defined by the least common multiple of the two exposure periods. For example, a double exposure method with exposure periods of $\Lambda_1=1000$ nm and $\Lambda_2=600$ nm can result in longer final periods (i.e. overall periods) of a metasurface containing multiple fill factors. FIGS. 7A and 7B show that the overall period of the metasurface under these conditions would result in $\Lambda_f=3000$ nm, which translates to the two exposure periodicities matching each other in their least common multiple and repeating in a periodic pattern. The overall of final period ($\Lambda_f$) can thereby contain for example ten different fill factors $F_1, F_2, F_3 \ldots F_{10}$, namely five fractions having a high refractive index and five fractions having a low refractive index. FIGS. 7C and 7D show 1D and 2D metasurfaces respectively with changing fill factor values resulting from two exposures with exposure periods where the second exposure periodicity is not equal to half of the first exposure period, in this instance for periodicities of $\Lambda_1=1000$ nm and $\Lambda_2=660$ nm, a $\Lambda_f=33000$ nm results. It will be appreciated that in the 2D metasurface, the fill factor varies in different directions.

Figure 7E:
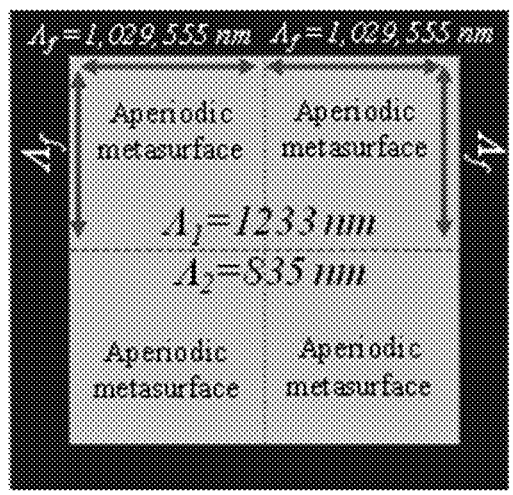

Additionally, in accordance with methods described herein, nonperiodic metasurfaces and gratings can be fabricated. This occurs, for example, when the least common multiple of the two exposure periodicities becomes large, or is increased beyond the nm or µm scales. As shown in FIG. 7E, two exposure periods of $\Lambda_1=1233$ nm and $\Lambda_2=835$ nm results in a final period or overall period of the metasurface of $\Lambda_f=1,029,555$ nm, which is approximately 1 mm. Thus in this example ~1 mm² areas having aperiodic metastructures can be realized. In this instance, the aperiodic cells spanning about 1 mm repeat with a period of 1 mm. Thus, for example, if the total exposure area is 1×1 cm², the resultant metasurface would contain an array of 10×10 mm² aperiodic cells.

Figure 8A:
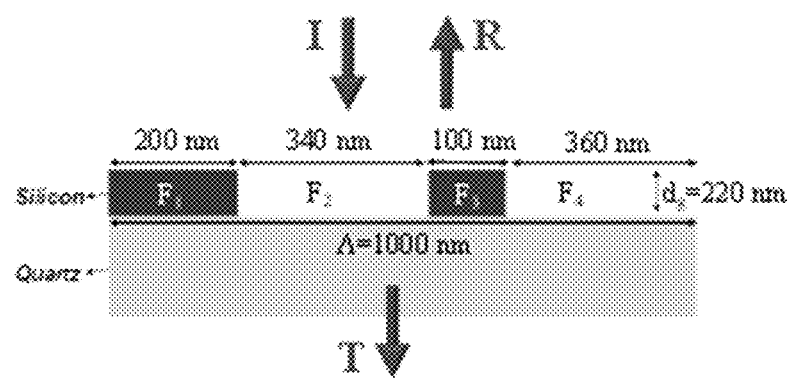
FIGS. 8A-D is a schematic of an example metasurface and corresponding measured and simulated spectra, fabricated in accordance with some aspects of the technology described herein.
Figure 8B:
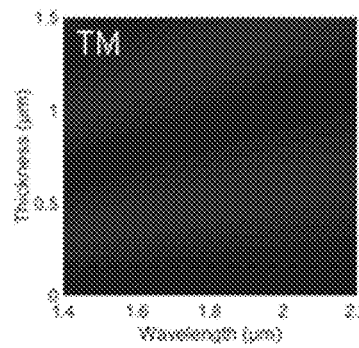
Figure 8C:
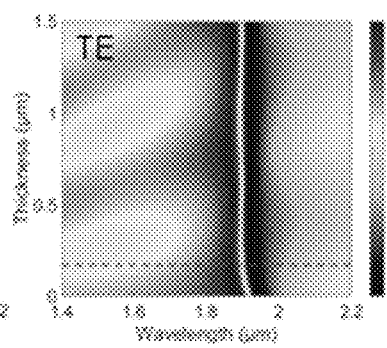
Figure 8D:
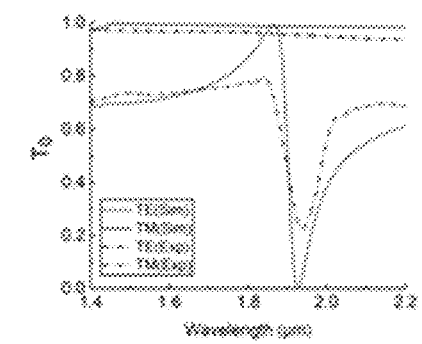

Turning now to FIGS. 8A-D the optical properties or spectra (simulated and experimental) corresponding to a 1D multipart (e.g. four-part) metasurface generated in accordance with methods disclosed herein are shown. The optical spectral measurements and simulations corresponding to a metasurface fabricated in accordance to methods described herein indicate wideband antireflection and guided-mode resonance response to Transverse Magnetic (TM) and Transverse Electric (TE) polarized input light respectively. In TM polarization, the electric field vector lies in the plane of incidence, and it is normal to the plane of incidence for TE polarization. FIG. 8A depicts a schematic rendition of a fabricated metasurface measuring 100 mm² having a 500 nm minimum feature size, where I denotes incident light wave, R denotes reflectance (intensity of reflected light divided by the intensity of the incident light), and T denotes transmittance. FIGS. 8B and 8C illustrate zero-order transmission ($T_0$) optical spectral maps that represent variation of the grating thickness ($d_g$) versus wavelength with respect to TM and TE polarization states of incident light, respectively. A non-resonant wideband antireflection spectrum is observed for the TM instance (for example, bandwidth ~800 nm), while the TE instance shows a guided-mode resonance dip or response in the near-IR band (for example spanning 1400-2200 nm) in the transmission map. The computed spectra according to the fabricated metasurface show wideband antireflection for TM (FIG. 8B) and resonance characteristics for TE (FIG. 8C). A zero order transmission ($T_0$) measurement can be carried out by collecting the transmitted output light of the metasurface, for example using a light detector and transferring it to an optical spectrum analyzer (OSA) via an optical fiber. Simulated and experimental spectra of a fabricated metasurface, illustrated in FIG. 8D correspond to a grating thickness of $d_g$=220 nm, additionally noted by the dotted lines in FIGS. 8B and 8C, for the instances of TE and TM incident polarized light. The discrepancy between the measured and simulated data illustrated in FIG. 8D is due to imperfect collimation of the interrogating laser light beam and efficiency reduction by reflection of the substrate backside.

Many different arrangements of the various components and/or steps depicted and described, as well as those not shown, are possible without departing from the scope of the claims below. Embodiments of the present technology have been described with the intent to be illustrative rather than restrictive. Alternative embodiments will become apparent from reference to this disclosure. Alternative means of implementing the aforementioned can be completed without departing from the scope of the claims below. Certain features and subcombinations are of utility and can be employed without reference to other features and subcombinations and are contemplated within the scope of the claims.

The invention claimed is:

1. A method of fabricating a metasurface, the method comprising:
   providing a photoresist film disposed on a substrate;
   exposing the photoresist film with a first interference pattern, the first interference pattern having a first period and a first exposure energy;
   exposing the photoresist film with a second interference pattern, the second interference pattern having a second period and a second exposure energy;
   rotating the substrate;
   exposing the photoresist film with a third interference pattern, the third interference pattern having a third period and a third exposure energy;
   exposing the photoresist film with a fourth interference pattern, the fourth interference pattern having a fourth period and a fourth exposure energy; and
   generating a two-dimensional periodic metasurface,
   wherein the first interference pattern and the second interference pattern are disposed along the same dimension;
   wherein the third interference pattern and the fourth interference pattern are disposed along the same dimension
   wherein the first period and the second period have a least common multiple (LCM) such that a final metasurface period is larger than either of the first period and the second period; and
   wherein the third period and the fourth period have a least common multiple (LCM) such that a final metasurface period is larger than either of the third period and the fourth period.

2. The method of claim 1, further comprising spin-coating the photoresist film onto the substrate.

3. The method of claim 1, further comprising:
   developing the exposed portions of the photoresist film to form a two-dimensional periodic pattern; and
   transferring the two-dimensional periodic pattern to the substrate.

4. The method of claim 1, wherein the substrate comprises a single film layer of at least one of a dielectric and a semiconductor.

5. The method of claim 1, wherein the substrate comprises a system of film layers.

6. The method of claim 1, wherein the substrate comprises at least one of silicon-on-quartz, silicon-on-insulator, germanium, zinc selenide, and zinc sulfide.

7. The method of claim 1, wherein the first period and the first exposure energy are equal to the third period and the third exposure energy.

8. The method of claim 1, wherein the second period and the second exposure energy are equal to the fourth period and the fourth exposure energy.

9. The method of claim 1, wherein the substrate is rotated 90 degrees.

10. The method of claim 1, wherein the substrate is rotated 60 degrees.

* * * * *